(12) United States Patent
Chiu et al.

(10) Patent No.: US 7,939,382 B2
(45) Date of Patent: May 10, 2011

(54) METHOD OF FABRICATING A SEMICONDUCTOR PACKAGE HAVING THROUGH HOLES FOR MOLDING BACK SIDE OF PACKAGE

(75) Inventors: Chin-Tien Chiu, Taichung (TW); Hem Takiar, Fremont, CA (US); Chih-Chin Liao, Changhua (TW); Cheemen Yu, Madison, WI (US); Ning Ye, San Jose, CA (US); Jack Chang Chien, Kaoshiung (TW)

(73) Assignee: SanDisk Corporation, Milpitas, CA (US)

( * ) Notice: Subject to any disclaimer, the term of this patent is extended or adjusted under 35 U.S.C. 154(b) by 394 days.

(21) Appl. No.: 11/770,078

(22) Filed: Jun. 28, 2007

(65) Prior Publication Data

US 2009/0004785 A1    Jan. 1, 2009

(51) Int. Cl.
*H01L 21/00* (2006.01)
(52) U.S. Cl. .................. 438/127; 257/E21.502
(58) Field of Classification Search .............. 438/127; 257/E21.502
See application file for complete search history.

(56) References Cited

U.S. PATENT DOCUMENTS

| | | | |
|---|---|---|---|
| 5,136,366 A | 8/1992 | Worp et al. | |
| 5,557,150 A | 9/1996 | Variot et al. | |
| 5,679,978 A | 10/1997 | Kawahara et al. | |
| 5,844,309 A | 12/1998 | Takigawa et al. | |
| 6,038,136 A * | 3/2000 | Weber | 361/783 |
| 6,157,086 A * | 12/2000 | Weber | 257/788 |
| 6,324,069 B1 * | 11/2001 | Weber | 361/783 |
| 6,451,625 B1 * | 9/2002 | Pu et al. | 438/108 |
| 6,495,083 B2 * | 12/2002 | Weber | 264/272.15 |
| 6,772,512 B2 * | 8/2004 | Tsai et al. | 29/840 |
| 6,780,681 B2 * | 8/2004 | Aoki | 438/124 |
| 7,075,172 B2 * | 7/2006 | Cigada et al. | 257/666 |
| 2004/0027869 A1 | 2/2004 | Miwa et al. | |

FOREIGN PATENT DOCUMENTS

JP    2003007924 A    10/2003

OTHER PUBLICATIONS

Response to Office Action filed Jan. 14, 2010 in U.S. Appl. No. 11/770,088.
Office Action dated Mar. 3, 2010 in U.S. Patent Appl. No. 11/770,088.
Office Action dated Oct. 14, 2009 in U.S. Appl. No. 11/770,088.
U.S. Appl. No. 11/770,088, filed on Jun. 28, 2007.

* cited by examiner

*Primary Examiner* — David A Zarneke
(74) *Attorney, Agent, or Firm* — Vierra Magen Marcus & DeNiro LLP

(57) ABSTRACT

A portable memory card and methods of manufacturing same are disclosed. The portable memory includes a substrate having a plurality of holes formed therein. During the encapsulation process, mold compound flows over the top surface of the substrate, through the holes, and down into a recessed section formed in the bottom mold cap plate to form a projection of mold compound on the bottom surface of the substrate.

30 Claims, 4 Drawing Sheets

METHOD OF FABRICATING A SEMICONDUCTOR PACKAGE HAVING THROUGH HOLES FOR MOLDING BACK SIDE OF PACKAGE

CROSS-REFERENCE TO RELATED APPLICATION

The following application is cross-referenced and incorporated by reference herein in its entirety:

U.S. patent application Ser. No. 11/770,088, entitled "Semiconductor Package Having Through Holes For Molding Back Side Of Package," by Chin-Tien Chiu, et al., filed on even date herewith.

BACKGROUND OF THE INVENTION

1. Field of the Invention

Embodiments of the present invention relate to methods for forming semiconductor packages, and semiconductor packages formed thereby.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate. The substrate may in general include a rigid base having a conductive layer etched on one or both sides. Electrical connections are formed between the die and the conductive layer(s), and the conductive layer(s) provide an electric lead structure for integration of the die into an electronic system. Once electrical connections between the die and substrate are made, the assembly is then typically encapsulated in a mold compound to provide a protective package.

Flash memory modules may either be portable, as in the case of a land grid array (LGA) package, or dedicated, as in the case of a ball grid array (BGA) package. Portable flash memory modules are fabricated with contact fingers that allow the modules to be used as removable memory. They may be inserted into a slot in a host device, whereupon the contact fingers are brought into pressure contact with a printed circuit board in the host device to allow communication between the memory module and host device. Dedicated memory modules on the other hand are soldered, or otherwise permanently affixed to the printed circuit board of a host device.

In view of the small form factor requirements, as well as the fact that flash memory cards need to be removable and not permanently attached to a printed circuit board, such cards are often built as land grid array (LGA) packages. In an LGA package, the semiconductor die are electrically connected to exposed contact fingers formed on a lower surface of the package. External electrical connection with a host printed circuit board is accomplished by bringing the contact fingers into pressure contact with complementary electrical pads on the printed circuit board. LGA packages are ideal for flash memory cards in that they have a smaller profile and lower inductance than pin grid array (PGA) and ball grid array (BGA) packages. Further examples of typical LGA packages are disclosed in U.S. Pat. Nos. 4,684,184, 5,199,889 and 5,232,372, which patents are incorporated by reference herein in their entirety.

A side view of a conventional LGA package 40 is shown in prior art FIG. 1. One or more memory die 20 and a controller die 22 are mounted on a substrate 24 in a stacked configuration, along with one or more passive components 26. Generally, the substrate 24 may be formed of a rigid core having thin film copper layer(s) on its top and/or bottom surfaces. An electrical lead pattern may be defined in the copper layer in a desired electrical lead pattern using known photolithography and etching processes. The copper film on the bottom surface may also be used to define a plurality of contact fingers 28 for communication with a host device.

The die may be electrically connected to the substrate by wire bonds 34. Vias (not shown) are formed through the substrate to allow electrical connection of the die through the substrate to the contact fingers 28. Once the die are electrically connected, the package may be encapsulated in a mold compound 36 to form the package 40.

During the encapsulation process, the substrate and die are positioned in a mold cavity defined by top and bottom mold plates. A mold compound, for example molten epoxy resin, is then injected into the mold cavity to encapsulate the die on the substrate. A lower surface of the substrate (i.e., the surface including contact fingers 28) is positioned against the bottom mold plate, so that the lower surface of the substrate typically does not receive any mold compound. It is also known to form recesses in the top mold plate which get filled with mold compound to define a projection 38 across the top surface of the finished package 40. The projection 38 is typically used as a finger grip. Instead of a recess in the top mold plate, it is also known to provide a projection on the top mold plate which in turn forms a recess in the top surface of the finished package 40.

It may be desirable to form a projection, as in projection 38, on the lower surface of the substrate. As is known in the art, injecting mold compound both above and below the substrate requires high mold compound pressures. During the molding process, the molding machine may output an injection force typically about 0.8 tons or higher to drive the mold compound into the mold cavity above and below the substrate. Such pressures may generate undesirable mold flash on a bottom surface of the substrate, which is excess mold compound on the lower surface of the substrate where no mold compound should be. It is known to clamp down the die and substrate with a high clamping force within the mold cavity, but such high forces may cause cracks in the die and/or substrate.

Moreover, given the constant drive toward smaller form factor packages, it is presently known to employ wafer backgrind during the semiconductor fabrication process to provide very thin semiconductor die. Such die are often unable to withstand the large stresses generated during high pressure molding processes, and frequently break. It is therefore desirable to employ a lower pressure injection molding process to encapsulate the die. If it is desired to have a projection on the bottom surface of the package, it is known to encase prior art semiconductor packages within plastic lids, which may have any configuration of projections on the bottom and/or top surface(s).

SUMMARY OF THE INVENTION

Embodiments of the present invention relate in general to a portable memory card and methods of manufacturing same.

The memory card includes a substrate having a plurality of holes formed therein. In embodiments, the plurality of holes are formed adjacent to an edge of the substrate. After one or more semiconductor die are mounted and electrically coupled to the substrate, the die and substrate assembly may be positioned within a mold chamber for encapsulating the die and at least portions of the substrate within a mold compound. The mold chamber may include top and bottom mold plates which together define a cavity within which the die and substrate assembly is positioned. The bottom mold plate may be formed with a recessed section aligning with the plurality of holes. Mold compound is injected into the cavity and flows over the surface of the substrate including the semiconductor die. Moreover, the mold compound flows through the holes and into the recessed section to form a projection of mold compound on the bottom surface of the substrate.

Providing the holes allows mold compound to flow to the bottom surface of the substrate under a low injection force of the mold compound. Moreover, relative to a pressure with which the mold compound flows over the top surface of the substrate, the number and diameter of holes provided through the substrate reduce the pressure with which the mold compound flows into the recessed section. This reduction in pressure prevents flashing of the mold compound on the lower surface of the substrate, outside of the recessed section.

DETAILED DESCRIPTION

Figure 1:
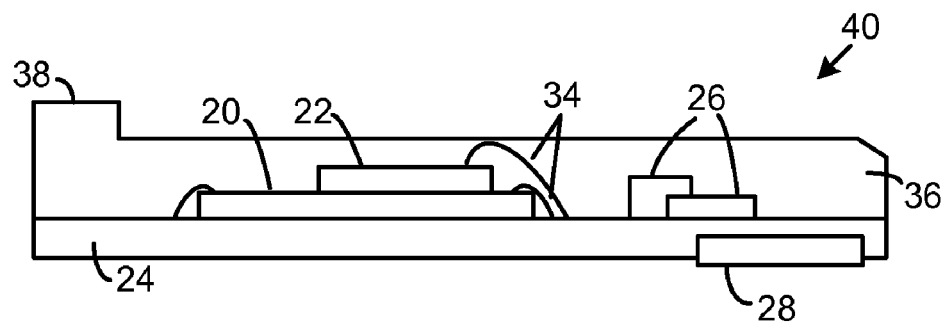
FIG. 1 is a side cross-sectional view of a conventional semiconductor package including a projection formed in the mold compound on a top surface of the package.
Figure 2:
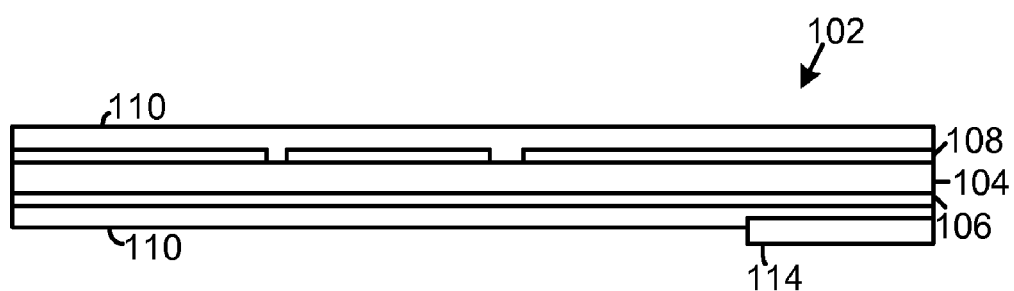
FIG. 2 is a side view of a substrate for use with embodiments of the present invention.

Embodiments of the invention will now be described with reference to FIGS. 2 through 9 which relate to a single-lid flash memory card and methods of manufacturing same. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

A method of fabricating the portable memory according to embodiments of the present invention will now be described with reference to the flowchart of FIG. 9 and the cross-sectional side and top views of FIGS. 2 through 8. FIGS. 2 through 8 show a single semiconductor die package 100 during various stages of fabrication. However, it is understood that the die package 100 may be batch processed as part of a panel including a number of semiconductor die packages 100 to achieve economies of scale. The fabrication process begins in step 200 with fiducial holes (not shown) being drilled in a panel on which the semiconductor die packages 100 are formed. The fiducial holes are used to register a position of the panel as it passes through process machines for fabricating package 100. The type of panel used in the present invention may for example be a leadframe, printed circuit board ("PCB"), a tape used in tape automated bonding ("TAB") processes, or other known substrates on which integrated circuits may be assembled and encapsulated.

In embodiments where the panel is a PCB, each semiconductor die package 100 may include a substrate 102. The substrate may be formed of a core 104, having a top conductive layer 106 formed on a top surface of the core 104, and a bottom conductive layer 108 formed on the bottom surface of the core 104. Although not critical to the present invention, the core 104 may be formed of various dielectric materials such as for example, polyimide laminates, epoxy resins including FR4 and FR5, bismaleimide triazine (BT), and the like. The conductive layers may be formed of copper or copper alloys, plated copper or plated copper alloys, Alloy 42 (42Fe/58Ni), copper plated steel, or other metals and materials known for use on substrates.

The metal layers 106, 108 may be etched in a step 202 with a conductance pattern, for example in a known photolithography process, to form a circuit on the substrate for communicating signals between one or more semiconductor die and an external device. In embodiments including conductance patterns in both layers 106 and 108, vias (not shown) may be provided to transmit electrical signals between the top and bottom surfaces of the substrate 102. The patterned substrate may then be inspected in an automatic optical inspection (AOI) in step 204.

Once patterned and inspected, the top and bottom surfaces of substrate 102 may be laminated with a solder mask 110 in a step 206. One or more gold layers (or other known plating material) may next be formed on portions of the top and/or bottom conductive layers 106, 108 in areas to be soldered. Additionally, in embodiments where substrate 102 is used for example as an LGA package, one or more gold layers may be formed on portions of the bottom conductive layer to define contact fingers 114 on the bottom surface of the semiconductor package as is known in the art for communication with external devices.

The one or more gold layers may be applied in a known electroplating process. It is known to apply a soft gold layer (step 210) to the solder pads and contact fingers and a hard gold layer (step 212) to the contact fingers to provide greater wear resistance. It is understood that only a single plating step may be employed. Moreover, it is understood that the semiconductor package 100 according to the present invention need not be an LGA package, and may be a variety of other packages in alternative embodiments including for example BGA packages. Contact fingers 114 may be omitted in such embodiments.

Figure 3:
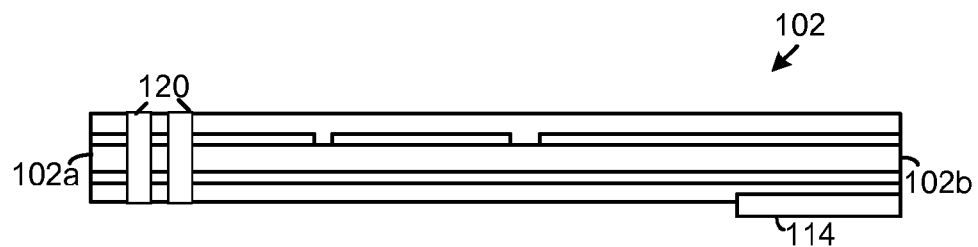
FIG. 3 is a cross-sectional side view of a substrate including mold compound holes according to embodiments of the present invention.
Figure 4:
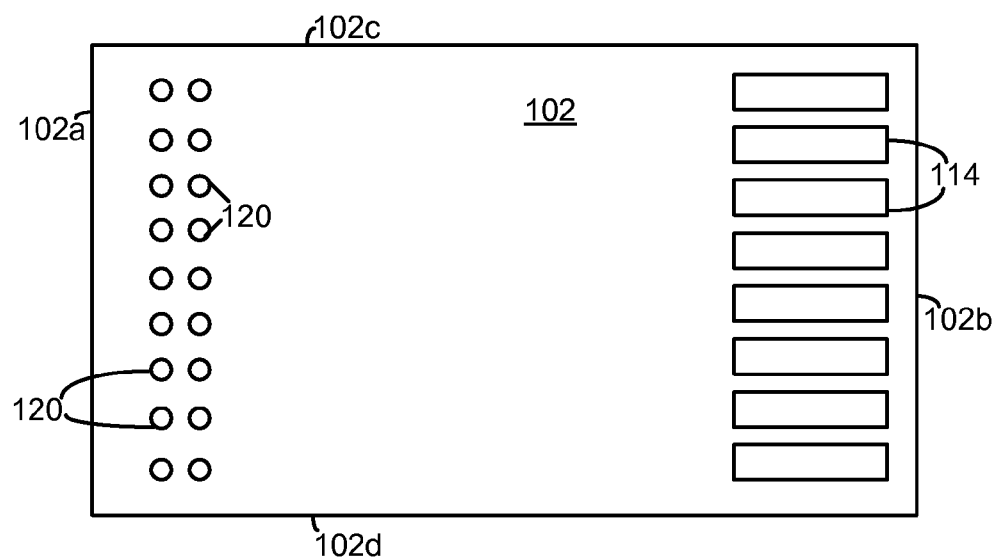
FIG. 4 is a bottom view of a substrate including mold compound holes according to embodiments of the present invention.
Figure 5:
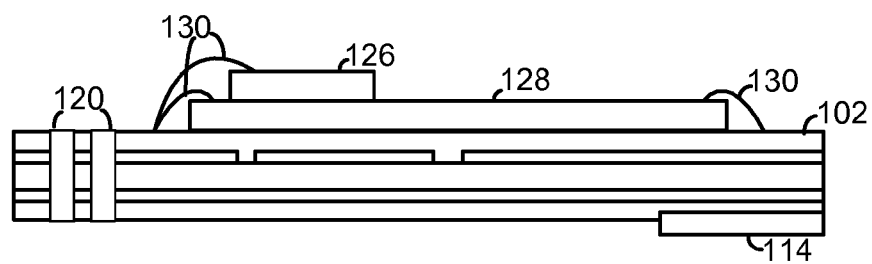
FIG. 5 is a cross-sectional side view of a substrate and semiconductor die assembly including mold compound holes according to embodiments of the present invention.
Figure 9:
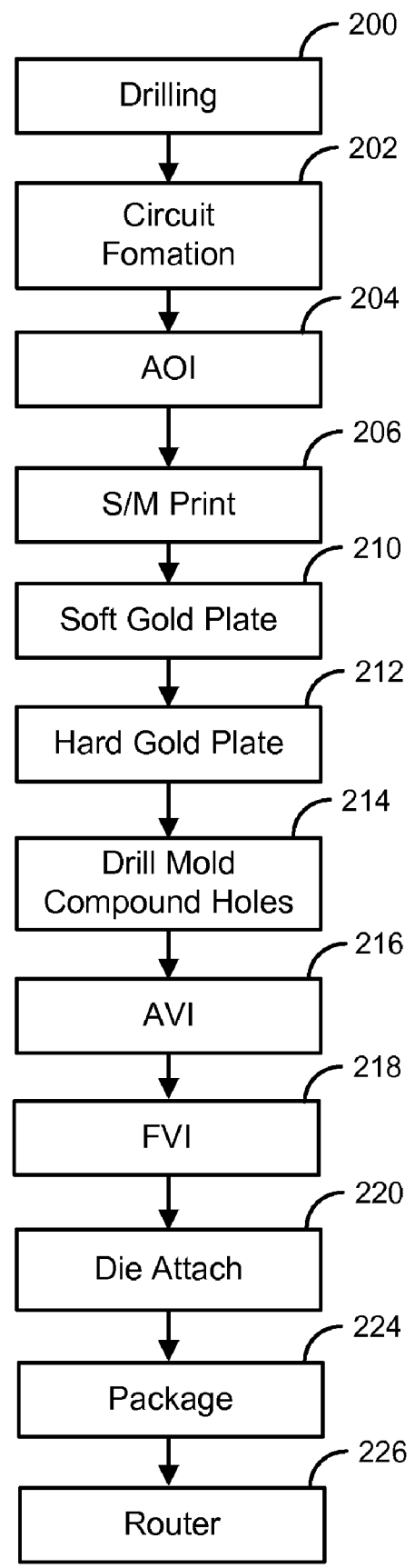
FIG. 9 is a flowchart of the method of fabricating a flash memory card according to embodiments of the present invention.

Referring now to FIGS. 3 and 4 and step 214 of FIG. 9, mold compound holes 120 may next be formed through the substrate. The holes 120 may be formed adjacent an edge 102a of the substrate, which is opposite an edge 102b at which the contact fingers 114 are formed. It is understood that the holes 120 may be formed closer to the contact fingers 114 in further embodiments.

While two rows including nine holes each are shown in the figures, it is understood that the number of holes and the configuration in which they are provided may vary in alternative embodiments. In embodiments, there may be one or more holes, and there may be a single row or more than two rows of holes 120. The holes 120 in one row are shown aligned with the adjacent hole in the next row. The holes of the adjacent rows may be staggered with respect to each other in further embodiments.

As explained hereinafter, the holes 120 are used to form a projection on the bottom surface of the substrate. The protrusion may extend across the entire width (from side 102a to side 102b) of the substrate. Accordingly, the holes 120 may also be provided across the entire width of the substrate. However, it is understood that the protrusion, and the holes 120, need not extend across the entire width of the substrate in further embodiments.

The holes may be formed through the substrate 102 by a drill or by a laser. In an embodiment including for example eighteen holes 120, each hole may have a diameter of between 0.05 mm and 2 mm, and more particularly, 0.1 mm to 1 mm. It is understood that, in embodiments including eighteen holes, the diameter of the holes may be less than 0.05 mm and greater than 2 mm in further embodiments. Moreover, it is understood that the diameter of the holes may be greater than the range set forth above when there are less than eighteen holes, and may be smaller than the range set forth above when there are more than eighteen holes. In addition to the number of holes, the diameter of the holes may in part be determined by the type of mold compound used.

The formation of the holes 120 in embodiments takes place in step 214 after the plating of the substrate in steps 210 and 212. It is understood that the holes 120 may be formed any time after application of the solder mask in step 206 and any time prior to the encapsulation step 224 described hereinafter.

The patterned and drilled substrate may next be inspected and tested in an automated step (step 216) and in a final visual inspection (step 218) to check electrical operation, and for contamination, scratches and discoloration. A plurality of semiconductor die 126, 128 and other passive components may next be affixed to the surface of the substrate, in embodiments opposite the surface of the substrate including the contact fingers 114. The semiconductor die 126, 128 may be mounted in step 220 in a known adhesive or eutectic die bond process, using a known die-attach compound. The number and type of semiconductor die 126, 128 are not critical to the present invention and may vary greatly. In one embodiment, die 126 may be a controller die such as an ASIC, which may be omitted in embodiments. There may be one or more die 128, which may include a flash memory array (e.g., NOR, NAND or other), S-RAM or DDT. Other semiconductor die are contemplated. The one or more die 126, 128 may be electrically connected to substrate 102 by wire bonds 130 in a known wire-bond process. The die may be stacked in a SiP arrangement, mounted side-by-side in an MCM arrangement, or affixed in another packaging configuration.

Figure 6:
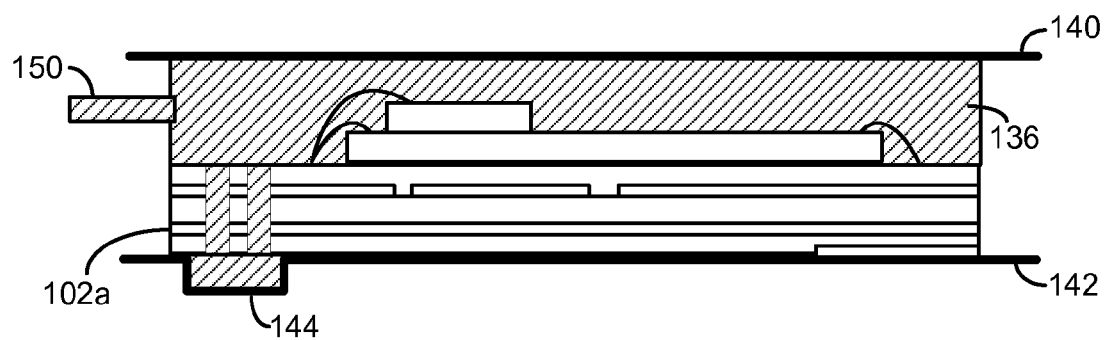
FIG. 6 is a cross-sectional side view of a substrate and semiconductor die assembly positioned within a mold compound chamber according to embodiments of the present invention.
Figure 7:
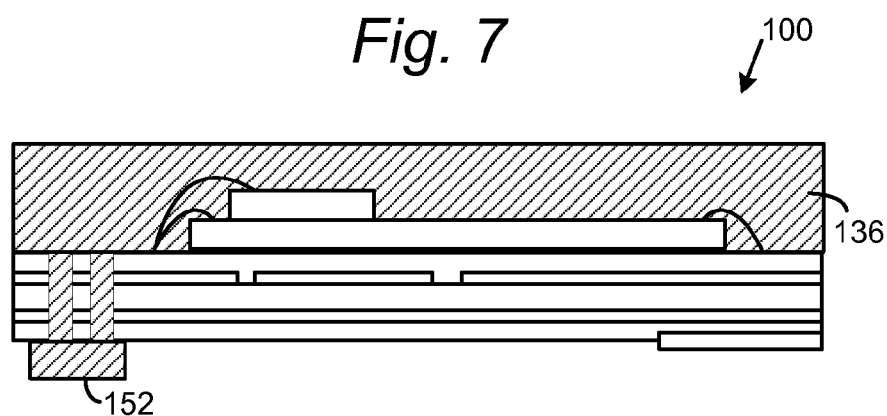
FIG. 7 is a cross-sectional side view of a semiconductor package including mold compound holes and a projection formed in the mold compound on a bottom surface of the substrate according to embodiments of the present invention.
Figure 8:
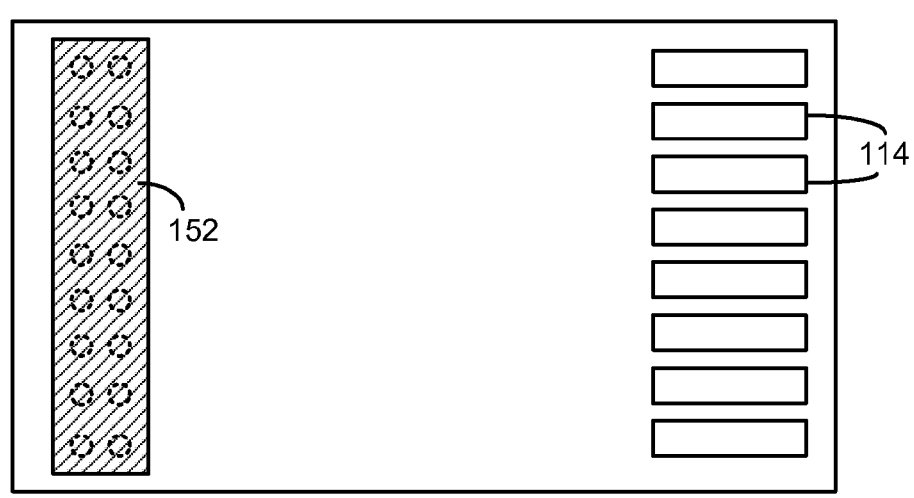
FIG. 8 is a bottom view of a semiconductor package including mold compound holes and a projection formed in the mold compound on a bottom surface of the substrate according to embodiments of the present invention.

Once the die 126, 128 are coupled to the substrate 102, the die and portions of the substrate may be encapsulated with a mold compound 136 in step 224 and as shown in FIGS. 6 through 8. Mold compound 136 may be an epoxy resin such as for example available from Sumitomo Corp. and Nitto Denko Corp., both having headquarters in Japan. Other mold compounds from other manufacturers are contemplated. The mold compound may be applied according to various processes, including by transfer molding or injection molding techniques.

FIG. 6 shows upper and lower mold cap plates 140 and 142. In embodiments of the present invention, the lower mold cap plate 142 may be formed with a recessed section 144. The position and dimensions of the recessed section 144 may vary in alternative embodiments. However, at least portions of the recessed section 144 are aligned with mold compound holes 120 so that mold compound 136 may flow through the holes 120 and into the recessed section 144 as explained hereinafter.

In one embodiment, the recessed section 144 may be positioned at the edge 102a of the substrate when the substrate is positioned between the mold cap plates. In alternative embodiments, the recessed section 144 may be positioned inward from the edge 102a of the substrate when the substrate is positioned between the mold cap plates, up to approximately ½ inch from the edge 102a. The recessed section may be positioned further inward than ½ inch in further embodiments. The recessed section may extend across the width of the substrate 102, but may extend only partially across the width in further embodiments. In embodiments, the recessed section is rectangular. It may however include rounded edges between the sides 102c and 102d in alternative embodiments.

The recessed section 144 may have a width (in the direction between edges 102a and 102b) of about 1 mm, but the width may be greater or lesser than that in alternative embodiments. In one such alternative embodiment, the recessed section may in fact extend across the entire length between edge 102a and 102b so that mold compound fills the recessed section 144 on the entire bottom surface of the substrate 102. In such an embodiment, the recessed section may include protrusions that align with the contact fingers 114 to prevent mold compound from covering the contact fingers 114 in this embodiment. The recessed section 144 may have a depth of about 1 mm, but the depth may be greater or lesser than that in alternative embodiments.

In operation, the assembly including the substrate 102 and die 126, 128 may be positioned in the mold chamber with the bottom surface of the substrate seated on mold cap plate 142. The assembly may be clamped in position. However, as a relatively low mold compound injection force is used as explained hereinafter, the clamping force may be sufficiently small to avoid damage to the substrate and/or semiconductor die. Mold compound 136 may then be injected into the mold chamber between mold cap plates 140, 142 and above the substrate 102 from a source 150.

The mold compound 136 flows over the top surface of substrate 102, encapsulating the semiconductor die 126, 128, wire bonds 130, and any other components on the upper surface of the substrate 102. A relatively low mold compound injection force may be used, which exerts a pressure on the substrate and die of for example between 0.45 Kg/mm$^2$ and 0.75 Kg/mm$^2$, and more particularly around 0.6 Kg/mm$^2$. This mold compound injection force poses little risk of damage to the semiconductor die 126, 128 and wire bonds 130.

The pressure exerted by the injected mold compound may be lower than 0.45 Kg/mm² and higher than 0.75 Kg/mm² in further embodiments.

The mold compound 136 also flows through the mold compound holes 120, filling the holes 120 and the recessed section 144 of the lower mold cap plate 142. The diameter of the holes 120 limits the flow rate and pressure of the mold compound flowing into the recessed section 144 to keep the mold compound in the recessed section 144 and to prevent flash of the mold compound onto the bottom surface of the substrate outside of the recessed section. In embodiments, surface tension of the holes 120 may limit the flow rate and pressure of the mold compound. In further embodiments, the holes may be made sufficiently small so that the mold compound flows through the holes 120 and fills the recessed section 144 and holes 120 by capillary action.

FIGS. 7 and 8 show cross-sectional side and bottom views of a completed package 100. When the package 100 is removed from the mold compound chamber, mold compound filling recessed section 144 forms a projection 152 formed on a bottom surface of the substrate in the completed package. The projection 152 may for example be used as a finger grip to aid in removal of the package 100 from a card slot or the like. The projection 152 is joined to the mold compound within the holes 120 and above the substrate so that projection 152 is sturdy and securely affixed to the package 100.

Although shown with a generic rectangular shape in FIG. 8, the molded package 100 may have irregular shapes in embodiments. A method for forming irregular shaped semiconductor packages is disclosed for example in U.S. patent application Ser. No. 11/265,337, entitled "Method of Manufacturing Flash Memory Cards," which application is assigned to the owner of the present application and which application is incorporated by reference herein in its entirety.

After molding step 224, the packages 100 may next be singulated from the panel in step 226 into individual packages 100. The package 100 shown in FIGS. 7 and 8 may be the completed flash memory card. Alternatively, a semiconductor package 100 may further be enclosed within an external lid (not shown) to form a finished flash memory card.

The package 100 may be formed according to any of a variety of standard card configurations including for example, an SD Card, a Compact Flash, a Smart Media Card, a Mini SD Card, a Transflash memory card or a Memory Stick, a Pico card, an MMC card and an RS-MMC card. Other devices are contemplated.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of forming a semiconductor package having a substrate including first and second surfaces and one or more semiconductor die on the first surface of the substrate, the substrate including one or more holes between the first and second surfaces, the method comprising the steps of:
   (a) positioning the substrate within a molding chamber including at least one mold plate having a recessed section adjacent the one or more holes formed through the substrate; and
   (b) injecting a mold compound over the first surface of the substrate, the mold compound encapsulating the one or more semiconductor die and flowing through the one or more holes into the recessed section of the at least one mold plate to form a finger grip on the second surface of the substrate to facilitate removal of the semiconductor package from a slot in a host device in which the semiconductor package is used.

2. A method as recited in claim 1, wherein said step (b) of injecting a mold compound over the first surface of the substrate comprises the step of injecting an epoxy resin over the first surface of the substrate.

3. A method as recited in claim 1, wherein said step (b) of injecting a mold compound over the first surface of the substrate and flowing through the one or more holes comprises the step of injecting the mold compound to exert a first pressure on the first surface and a second pressure, lower than the first pressure, on the recessed section of the mold plate.

4. A method as recited in claim 1, wherein said step (b) of injecting a mold compound over the first surface of the substrate and flowing through the one or more holes comprises the step of controlling a pressure exerted by the mold compound within the recessed section of the molding plate by controlling the number and diameter of the one or more holes.

5. A method as recited in claim 1, further comprising the step (c) of forming a plurality of contact fingers on the second surface of the substrate, adjacent a first edge of the package.

6. A method as recited in claim 5, wherein said step (b) of injecting a mold compound over the first surface of the substrate and flowing through the one or more holes to form a projection on the second surface comprises the step of forming the projection adjacent a second edge of the package opposite the first edge of the package.

7. A method as recited in claim 6, wherein said step (b) of injecting a mold compound over the first surface of the substrate and flowing through the one or more holes to form a projection on the second surface comprises the step of forming the projection to end less than ½ inch from the second edge of the package.

8. A method as recited in claim 6, wherein said step (b) of injecting a mold compound over the first surface of the substrate and flowing through the one or more holes to form a projection on the second surface comprises the step of forming the projection across substantially the entire second surface except over the plurality of contact fingers.

9. A method of forming a semiconductor package having a substrate including first and second surfaces, one or more semiconductor die on the first surface of the substrate and contact fingers along a first edge of the second surface, the method comprising the steps of:
   (a) forming one or more holes through the substrate between the first and second surfaces of the substrate, the one or more holes positioned adjacent a second edge opposite the first edge;
   (b) positioning the substrate within a molding chamber including at least one mold plate having a recessed section adjacent the one or more holes formed in said step (a); and
   (c) injecting a mold compound over the first surface of the substrate, the mold compound encapsulating the one or more semiconductor die and flowing through the one or more holes formed in said step (a) into the recessed section of the at least one mold plate to form a finger grip on the second surface of the substrate, the finger grip being gripped when removing the semiconductor package from a slot of a host device.

10. A method as recited in claim 9, wherein said step (a) of forming one or more holes through the substrate comprises the step of drilling one or more holes through the substrate.

11. A method as recited in claim 9, wherein said step (a) of forming one or more holes through the substrate comprises the step of forming one or more holes through the substrate using a laser.

12. A method as recited in claim 9, wherein said step (a) of forming one or more holes through the substrate is performed prior to mounting of the one or more semiconductor die on the substrate.

13. A method as recited in claim 9, wherein said step (a) of forming one or more holes through the substrate comprises the step of forming between 10 and 20 holes in the substrate.

14. A method as recited in claim 13, wherein said step of forming between 10 and 20 holes in the substrate comprises the step of forming between 10 and 20 holes having a diameter of less than ½ mm.

15. A method as recited in claim 9, wherein said step (a) of forming one or more holes through the substrate comprises the step of forming two rows of holes.

16. A method as recited in claim 9, wherein said step (c) of injecting a mold compound over the first surface of the substrate comprises the step of injecting an epoxy resin over the first surface of the substrate.

17. A method as recited in claim 9, wherein said step (c) of injecting a mold compound over the first surface of the substrate and flowing through the one or more holes comprises the step of injecting the mold compound to exert a first pressure on the first surface and a second pressure, lower than the first pressure, on the recessed section of the mold plate.

18. A method as recited in claim 9, wherein said step (c) of injecting a mold compound over the first surface of the substrate and flowing through the one or more holes comprises the step of controlling a pressure exerted by the mold compound within the recessed section of the molding plate by controlling the number and diameter of the one or more holes.

19. A method as recited in claim 9, further comprising the step (d) of forming a plurality of contact fingers on the second surface of the substrate, adjacent a first edge of the package.

20. A method as recited in claim 19, wherein said step (c) of injecting a mold compound over the first surface of the substrate and flowing through the one or more holes to form a projection on the second surface comprises the step of forming the projection adjacent a second edge of the package opposite the first edge of the package.

21. A method as recited in claim 20, wherein said step (c) of injecting a mold compound over the first surface of the substrate and flowing through the one or more holes to form a projection on the second surface comprises the step of forming the projection to end less than ½ inch from the second edge of the package.

22. A method as recited in claim 20, wherein said step (c) of injecting a mold compound over the first surface of the substrate and flowing through the one or more holes to form a projection on the second surface comprises the step of forming the projection across substantially the entire second surface except over the plurality of contact fingers.

23. A method as recited in claim 9, further comprising the step (e) of encasing the die and substrate encapsulated in said steps (b) and (c) within a lid.

24. A method of forming a semiconductor package having a substrate including first and second surfaces and one or more semiconductor die on the first surface of the substrate, the method comprising the steps of:
 (a) forming a plurality of holes through the substrate between the first and second surfaces of the substrate;
 (b) positioning the substrate within a molding chamber including at least one mold plate having a recessed section adjacent the plurality of holes formed in said step (a); and
 (c) injecting a mold compound over the first surface of the substrate, the mold compound encapsulating the one or more semiconductor die and flowing through the plurality of holes formed in said step (a) into the recessed section of the at least one mold plate to form a finger grip on the second surface of the substrate to facilitate removal of the semiconductor package from a host device, the mold compound is injected with a force allowing the mold compound to encapsulate the one or more semiconductor die on the first surface, and the number and diameter of the plurality of holes prevent flash on the second surface outside of the recessed section.

25. A method as recited in claim 24, wherein said step (a) of forming the plurality of holes through the substrate comprises the step of forming between 10 and 20 holes in the substrate.

26. A method as recited in claim 25, wherein said step of forming between 10 and 20 holes in the substrate comprises the step of forming between 10 and 20 holes having a diameter of less than ½ mm.

27. A method as recited in claim 24, wherein said step (a) of forming the plurality of holes through the substrate comprises the step of forming two rows of holes.

28. A method as recited in claim 24, further comprising the step (d) of forming a plurality of contact fingers on the second surface of the substrate, adjacent a first edge of the package.

29. A method as recited in claim 28, wherein said step (c) of injecting a mold compound over the first surface of the substrate and flowing through the plurality of holes to form a projection on the second surface comprises the step of forming the projection adjacent a second edge of the package opposite the first edge of the package.

30. A method as recited in claim 24, further comprising the step (e) of encasing the die and substrate encapsulated in said steps (b) and (c) within a lid.

\* \* \* \* \*